United States Patent
Fuse

(10) Patent No.: US 7,400,216 B2
(45) Date of Patent: Jul. 15, 2008

(54) SURFACE ACOUSTIC WAVE DEVICE

(75) Inventor: Nobuo Fuse, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 336 days.

(21) Appl. No.: 10/563,786

(22) PCT Filed: Jul. 28, 2004

(86) PCT No.: PCT/JP2004/011122

§ 371 (c)(1),
(2), (4) Date: Jan. 6, 2006

(87) PCT Pub. No.: WO2005/011114

PCT Pub. Date: Feb. 3, 2005

(65) Prior Publication Data

US 2006/0197630 A1  Sep. 7, 2006

(30) Foreign Application Priority Data

Jul. 29, 2003  (JP)  ............................. 2003-281608

(51) Int. Cl.
*H03H 9/72* (2006.01)
*H03H 9/64* (2006.01)
(52) U.S. Cl. ...................... 333/133; 333/193
(58) Field of Classification Search .................. 333/133
See application file for complete search history.

(56) References Cited

U.S. PATENT DOCUMENTS

| | | | | |
|---|---|---|---|---|
| 5,864,260 A * | 1/1999 | Lee | ............................. | 333/133 |
| 6,297,712 B1 * | 10/2001 | Kadota et al. | ................ | 333/133 |
| 6,380,823 B1 * | 4/2002 | Ikata et al. | .................... | 333/133 |
| 6,566,981 B2 * | 5/2003 | Urabe et al. | ................. | 333/193 |
| 6,943,649 B2 * | 9/2005 | Takeda | ......................... | 333/193 |
| 7,030,716 B2 * | 4/2006 | Tsutsumi et al. | ............. | 333/133 |
| 7,196,594 B2 * | 3/2007 | Cheema et al. | .............. | 333/133 |

FOREIGN PATENT DOCUMENTS

| | | | | |
|---|---|---|---|---|
| JP | 55-72337 | 5/1980 | | |
| JP | 5-299969 | * 11/1993 | .................. | 333/193 |
| JP | 9-116382 | 5/1997 | | |
| JP | 2002-335143 | 11/2002 | | |
| JP | 2003-051731 | 2/2003 | | |

* cited by examiner

*Primary Examiner*—Barbara Summons
(74) *Attorney, Agent, or Firm*—Wenderoth, Lind & Ponack, L.L.P.

(57) ABSTRACT

A surface acoustic wave device has a structure in which a surface acoustic wave element (11), provided with two kinds of surface acoustic wave filter structures having different center frequencies on the same piezoelectric substrate (12), is disposed on a package (16). The surface acoustic wave element (11) comprises a first filter structure (13) having a first center frequency, a second filter structure (14) having a second center frequency and a shield electrode (15) between the first filter structure (13) and the second filter structure (14). The shield electrode (15) is connected to an earth terminal (181) of the package (16) to be grounded. According to the structure, electromagnetic shielding between the first filter structure (13) and the second filter structure (14) can be performed, therefore, the isolation property therebetween can be improved and the surface acoustic wave device can be miniaturized.

21 Claims, 14 Drawing Sheets

SURFACE ACOUSTIC WAVE DEVICE

TECHNICAL FIELD

The invention relates to a surface acoustic wave device used for a mobile phone and the like, particularly, to a surface acoustic wave device such as a surface acoustic wave filter or a surface acoustic wave duplexer to which filters having different center frequencies are provided on one piezoelectric substrate.

BACKGROUND ART

Conventionally, a surface acoustic wave device to which filters having different center frequencies are provided on one piezoelectric substrate, particularly, a surface acoustic wave duplexer (hereinafter, referred to as a SAW duplexer) is known as the one having a structure shown in FIG. 14. FIG. 14 is a top view showing the inside of a package of the conventional SAW duplexer. In FIG. 14, SAW duplexer 300 includes surface acoustic wave element 304 (hereinafter, referred to as SAW element), package 305 which houses the element, wire lead 307 which connects between them, and a cover not shown. In SAW element 304, transmission filer 302 and reception filter 303 are formed on a surface of piezoelectric substrate 301 made of a lithium tantalate (LiTaO$_3$) single crystal substrate and the like. After housing SAW element 304 in package 305, connection terminal patterns 3021, 3031 of transmission filter 302 and reception filter 303 are connected to terminal portions 306 of package 305 by wire leads 307 to obtain electrical conduction, then, the not-shown cover is sealed to package 305 to fabricate the device.

In such SAW duplexer 300, lower costs, smaller and thinner device are further required, and it is required that SAW element 304 which integrally forms transmission filter 302 and reception filter 303 is further miniaturized. However, if a shape of SAW element 304 is miniaturized, electromagnetic interference occurs between transmission filter 302 and reception filter 303, therefore, there is a problem that the isolation property deteriorates.

With respect to the problem, a SAW duplexer having good isolation property even when miniaturized is disclosed in Unexamined Japanese Patent Publication No. 2000-335143. The SAW duplexer includes a package in which a transmission terminal, a reception terminal, an antenna terminal and a ground terminal are formed, a phase shifter formed inside the package and one end of which is connected to the antenna terminal, a transmission filter mounted inside the package and an input side of which is connected to the transmission terminal and an output side of which is connected to the input terminal of the phase shifter, and a reception filter mounted inside the package and an input side of which is connected to an output terminal of the phase shifter and an output side of which is connected to the reception terminal, in which one terminal of the phase shifter is provided at the same end portion as the antenna terminal formed in the package and the other terminal of the phase shifter is provided at the opposite end portion of the one terminal of the phase shifter. According to this, the distance between the input terminal and the output terminal of the phase shifter can be long, therefore, electromagnetic interference of transmission signals and reception signals therebetween can be prevented.

In the disclosed example, the SAW element connects the transmission filter and the reception filter formed on the same piezoelectric substrate by the phase shifter provided in the package, thereby preventing electromagnetic interference. However, the prevention of electromagnetic interference by means of the SAW element itself or a connection structure of wire leads and the like for connecting from the SAW element to the package is not shown at all.

An object of the invention is to provide a small surface acoustic wave device having good filter properties, as well as which is low in cost, in which the isolation property is improved while preventing electromagnetic interference by providing a shield electrode between filter structures having two different center frequencies.

DISCLOSURE OF THE INVENTION

To achieve the above object, a surface acoustic wave device of the invention has a structure in which a surface acoustic wave element provided with two kinds of surface acoustic wave filter structures having different center frequencies on the same piezoelectric substrate is disposed on a package. The surface acoustic wave element comprises a first filter structure having a first center frequency, a second filter structure having a second center frequency and a shield electrode between the first filter structure and the second filter structure, in which the shield electrode is connected to an earth terminal of the package to be grounded.

According to the structure, electromagnetic shielding between the first filter structure and the second filter structure can be performed, therefore, the isolation property therebetween can be improved and the surface acoustic wave element can be miniaturized.

The surface acoustic wave device of the invention can be a structure in which the surface acoustic wave element further comprises a connection pattern which connects an earth terminal pattern of either the first filter structure or the second filter structure to the shield electrode. According to the structure, it is unnecessary to connect the shield electrode to earth terminal of the package, therefore, a connecting process of the wire lead can be simplified.

The surface acoustic wave device of the invention can be a structure in which the shield electrode of the surface acoustic wave element has a first shield electrode and a second shield electrode, further comprises a first connection pattern which connects an earth terminal pattern of the first filter structure to the first shield electrode and a second connection pattern which connects an earth terminal pattern of the second filter structure to the second shield electrode. According to the structure, the width of the shield electrode is widened, and respective earth terminal patterns are connected to earth terminals of the package, therefore, the isolation property can be further improved. Further, since it is not necessary to connect the shield electrode to earth terminals of the package, a connecting process by the wire lead can be simplified.

The surface acoustic wave device of the invention can be a structure further comprising a pattern in which the shield electrode crosses a signal wire lead connecting at least one signal line terminal pattern in the first filter structure and the second filter structure to a signal terminal of the package, and the shield electrode is connected to earth terminals of the package by at least two earth wire leads. According to the structure, electromagnetic leakage emitted from the signal wire lead can be efficiently suppressed.

The surface acoustic wave device of the invention can be a structure in which the shield electrode is formed to be longer than the first filter structure and the second filter structure so as to segment the first filter structure and the second filter structure. According to the structure, electromagnetic leakage can be efficiently suppressed.

The surface acoustic wave device of the invention can be a structure in which the two earth wire leads connecting the shield electrode to earth terminals of the package are arranged at both sides of the signal wire lead connecting the signal line terminal pattern to the signal terminal of the package. According to the structure, since earth wire leads are arranged at both sides of the signal wire lead, electromagnetic leakage from the signal wire lead can be further suppressed.

The surface acoustic wave device of the invention can be a structure in which the earth wire leads are respectively connected to earth terminals disposed at opposite positions of terminal portions of the package in which the surface acoustic wave element is housed. According to the structure, the shield electrode can be formed to be long so as to segment the first filter structure and the second filter structure, and can be connected to the earth terminals at both sides of the package, therefore, the attenuation in a low frequency and the isolation property in a low frequency can be improved.

The surface acoustic wave device of the invention can be a structure in which the first filter structure, the second filter structure and the shield electrode of the surface acoustic wave element are disposed in a vertical direction to a propagation direction of surface acoustic wave of the first filter structure and the second filter structure. According to the structure, the miniaturization of a surface acoustic wave element can be realized while improving the isolation property.

The surface acoustic wave device of the invention can be a structure in which the first filter structure and the second filter structure are ladder circuits connecting one-terminal surface acoustic wave resonators in series arms and in parallel arms, and a surface acoustic wave resonator which is nearest to the second filter structure in the first filter structure having a relatively low center frequency is a parallel arm, and a surface acoustic wave resonator which is nearest to the first filter structure in the second filter structure is a series arm. According to the structure, the difference between resonant frequencies of resonators which are arranged nearest to each other in the first filter structure and the second filter structure can be largest. As a result, the isolation property can be further improved, and a small SAW duplexer having good isolation property can be obtained.

The surface acoustic wave device of the invention can be a structure in which the shield electrode has a grating shape including plural slits in a vertical direction to comb-shaped electrodes in the first filter structure and the second filter structure. According to the structure, not only electromagnetic leakage but also acoustic leakage as surface acoustic wave can be suppressed.

The surface acoustic wave device of the invention can be a structure in which the first filter structure and the second filter structure of the surface acoustic wave element are disposed in parallel to a propagation direction of surface acoustic wave in the first filter structure and the second filter structure, and the shield electrode is disposed in a vertical direction to the propagation direction of surface acoustic wave. According to the structure, the miniaturization of the surface acoustic wave element can be realized while improving the isolation property.

The surface acoustic wave device of the invention can be a structure in which the shield electrode has a grating shape including plural slits in a parallel direction to comb-shaped electrodes in the first filter structure and the second filter structure. According to the structure, not only electromagnetic leakage but also acoustic leakage as surface acoustic wave can be suppressed.

The surface acoustic wave device of the invention can be a structure in which the shield electrode has a grating shape including plural slits in an oblique direction to a propagation direction of surface acoustic wave in the first filter structure and the second filter structure. According to the structure, not only electromagnetic leakage but also acoustic leakage as surface acoustic wave can be suppressed.

The surface acoustic wave device of the invention can be a structure in which the slits of the shield electrode are formed by pitches between the minimum pitch and the maximum pitch of comb-shaped electrodes included in the first filter structure and the second filter structure. According to the structure, the pitch of the slits can be set in accordance with a frequency at which the isolation property is required to be improved.

The surface acoustic wave device of the invention can be a structure in which the slits of the shield electrode are formed by different pitches depending on positions. According to the structure, the pitch of the slits can be set in accordance with plural frequencies at which the isolation property is required to be improved.

The surface acoustic wave device of the invention can be a structure in which an earth terminal pattern of the filter structure of which center frequency is relatively higher in the first filter structure and the second filter structure is connected to the shield electrode by a connection pattern, at least two earth wire leads are connected to the shield electrode and the earth terminal pattern, and the earth wire leads are respectively connected to the earth terminals disposed at both sides in the package, sandwiching the surface acoustic wave element. Generally, in the filter structure having a high frequency, the low-frequency attenuation and the low-frequency isolation property are affected a lot by a way of connecting an earth.

According to the structure, the shield electrode is formed to be long so as to segment the first filter structure and the second filter structure of the surface acoustic wave element, and earth terminals of opposite positions in the package are connected to the shield electrode by the earth wire leads, therefore, the low-frequency attenuation and the low-frequency isolation property in the filter structure having the higher frequency can be improved. Further, since the length of the earth wire lead can be shorten, variations can be reduced. Because the earth wire lead is short, it does not touch the SAW element.

The surface acoustic wave device of the invention can be a structure in which an earth terminal pattern of the filter structure of which center frequency is relatively lower in the first filter structure and the second filter structure is connected to the shield electrode by a connection pattern, at least two earth wire leads are connected to the shield electrode and the earth terminal pattern, and the earth wire leads are respectively connected to the earth terminals disposed at both sides in the package, sandwiching the surface acoustic wave element. Generally, in the filter structure having a low frequency, the high-frequency attenuation and the high-frequency isolation property are hardly affected by a way of connecting an earth terminal.

According to the structure, when the earth terminal pattern is connected to the shield electrode by the connection pattern, the high-frequency attenuation and the high-frequency isolation property hardly fluctuate, therefore, it becomes easy to design. In addition, it becomes possible to suppress electromagnetic leakage and to improve the isolation property.

The surface acoustic wave device of the invention can be a structure in which the first filter structure and the second filter structure are respectively a transmission filter and a reception filter, and the transmission filter and the reception filter forms a SAW duplexer. It also can be a structure in which the signal line terminal pattern is an input/output terminal pattern of either the transmission filter or the reception filter. According to the structure, the isolation property can be improved, therefore, a smaller SAW duplexer can be realized.

As described above, the surface acoustic wave device of the invention is provided with the first filter structure and the second filter structure on the same piezoelectric substrate, and the shield electrode connected to the earth terminal of the package is disposed therebetween, thereby improving the isolation property and obtaining a smaller surface acoustic wave device.

BEST MODE FOR CARRYING OUT THE INVENTION

Hereinafter, embodiments of the invention will be explained with reference to the drawings. Since same marks are put on the same components, explanations thereof are omitted in some cases. In the following embodiments, a SAW duplexer will be explained as an example of a surface acoustic wave device.

First Embodiment

Figure 1:
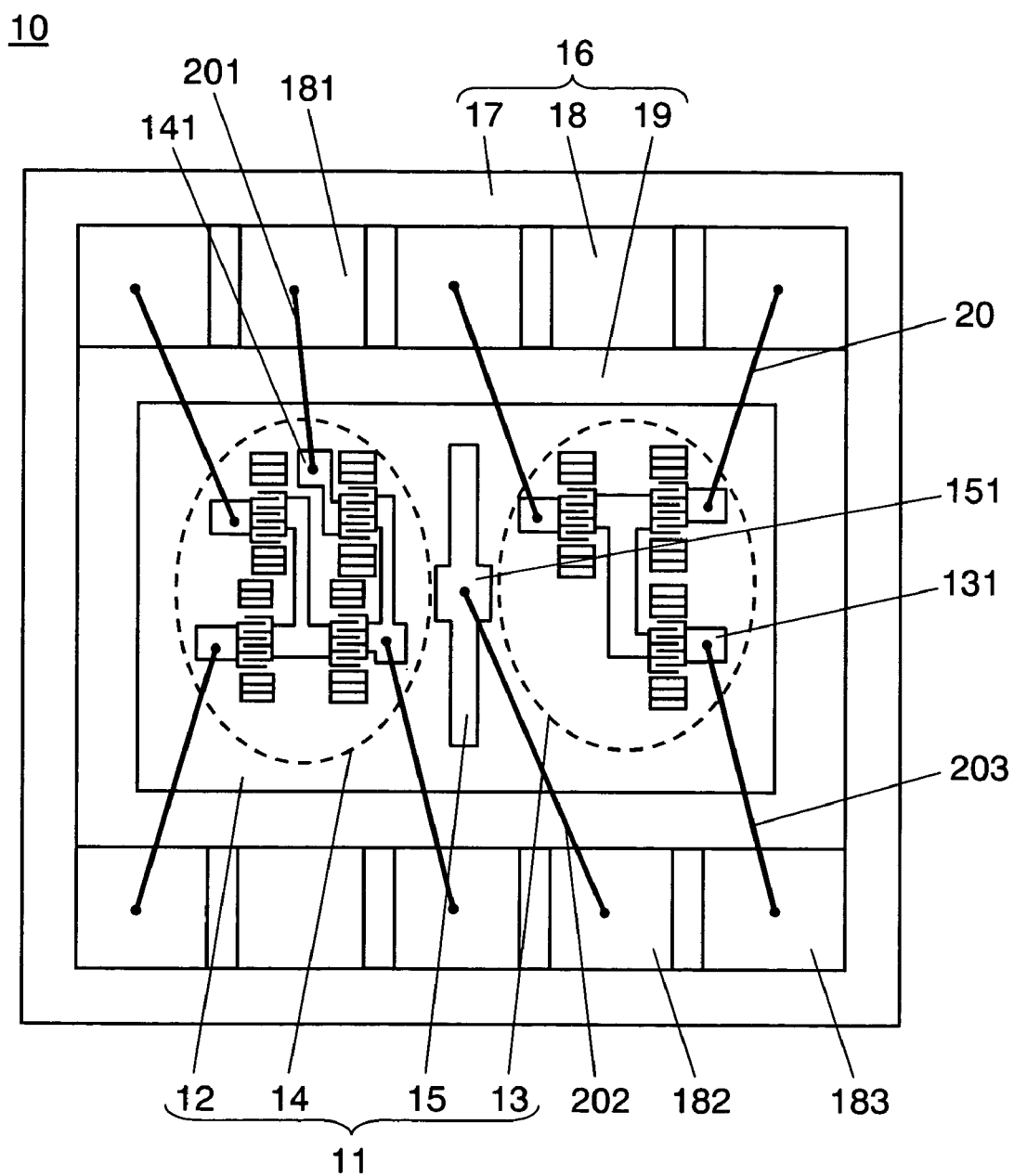
FIG. 1 is a top view showing an inside structure by removing a cover of a package in a SAW duplexer according to a first embodiment of the invention.

FIG. 1 is a top view showing an inside structure by removing a cover of a package in a SAW duplexer according to a first embodiment of the invention.

SAW duplexer 10 includes SAW element 11, package 16 to which SAW element 11 is fixed by bonding, wire leads 20 which connect electrode terminal patterns of SAW element 11 to terminal portions 18 of package 16 and a cover not shown.

As SAW element 11, piezoelectric substrate 12 having piezoelectricity such as a lithium tantalate ($LiTaO_3$) single crystal substrate, a lithium niobate ($LiNbO_3$) single crystal substrate, and a crystal substrate is used. An electrode thin film mainly including aluminum (Al) is formed on a surface of piezoelectric substrate 12 and a prescribed pattern shape is formed by performing a photolithography process and an etching process. SAW element 11 shown in FIG. 1 includes transmission filter 13 as a first surface acoustic wave filter structure, reception filter 14 as a second surface acoustic wave filter structure and a shield electrode 15 formed between transmission filter 13 and reception filter 14.

Transmission filter 13, reception filter 14, and shield filter 15 are disposed in a vertical direction to a propagation direction of surface acoustic wave.

Package 16 is made of, for example, a ceramic material, including joining portion 17 for joining the cover, terminal portions 18 having a lower step than joining portion 17, to which wire leads 20 are bonded, and bottom portion 19 having a lowest step, to which SAW element 11 is fixed by bonding. Terminal portions 18 have conductor patterns drawn from the ceramic material having a multilayer structure to a reverse portion, and soldering terminal portions (not shown) are provided at the reverse portion. The jointing between joining portion 17 and the cover is performed by various kinds of methods such as a soldering, a thermal welding, an ultrasonic bonding or bonding by adhesive resin.

Wire leads 20 are connected by a wire bonding using a thermal compression bonding method or an ultrasonic method and the like.

In the embodiment, transmission filter 13 and reception filter 14 have a ladder circuit respectively, in which one-terminal surface acoustic wave resonators are connected in series arms and in parallel arms. Shield electrode 15 is formed between transmission filter 13 and reception filter 14, in which shield terminal pattern 151 of shield electrode 15 is connected to earth terminal 182 of terminal portions 18 of package 16 by earth wire lead 202. According to this, electromagnetic shield effect can be obtained and the isolation property between transmission and reception can be improved.

Transmission-side earth terminal pattern 131 of transmission filter 13 is connected to earth terminal 183 of terminal portions 18 of package 16 by earth wire lead 203. Further, reception-side earth terminal pattern 141 of reception filter 14 is connected to earth terminal 181 of terminal portions 18 of package 16 by earth wire lead 201. Other connection terminal patterns in transmission filter 13 and reception filter 14 are connected to respective terminal portions 18 of package 16 by wire leads 20.

The larger the width of shield electrode 15 is, the more the isolation property is improved, however, when the width becomes larger, the chip size also becomes large. In order to make the chip size smaller while making the isolation property good, it is preferable to set the width of a wavelength to approximately 10 to 50 times larger than the wavelength which corresponds to a center frequency of the lower filler in transmission filter 13 and reception filter 14.

An example of a structure of SAW element 11 will be explained as follows. A center frequency of transmission filter 13 is set to 836.5 MHz, and a center frequency of reception filter 14 is set to 881.5 MHz. For that purpose, a 36°Y-cut X propagation lithium tantalate ($LiTaO_3$) single crystal substrate is used as piezoelectric substrate 12. A thin film having a structure in which copper (Cu)-added aluminum (Al) alloy and titanium (Ti) are stacked on a surface of piezoelectric substrate 12 is made to be an electrode film. The film thickness thereof is approximately 400 nm.

The resonators in series arms and parallel arms of transmission filter 13 respectively have pitches of 2.32 μm and 2.43 μm, and these of reception filter 14 respectively have pitches of 2.20 μm and 2.31 μm. The width of shield electrode 15 formed between transmission filter 13 and reception filter 14 is approximately 100 μm.

SAW element 11 fabricated as described above is fixed by bonding to package 16, and connection terminal patterns of SAW element 11 and terminal portions 18 of package 16 are connected by wire leads 20, finally, sealed with the cover to fabricate SAW duplexer 10. Shield terminal pattern 151 of shield electrode 15 is connected to earth terminal 182 of package 16 by earth wire lead 202. Further, transmission-side earth terminal pattern 131 of transmission filter 13 is connected to earth terminal 183 of package 16 by earth wire lead 203, and reception-side earth terminal pattern 141 of reception filter 14 is connected to earth terminal 181 of package 16 by earth wire lead 201.

Figure 2:
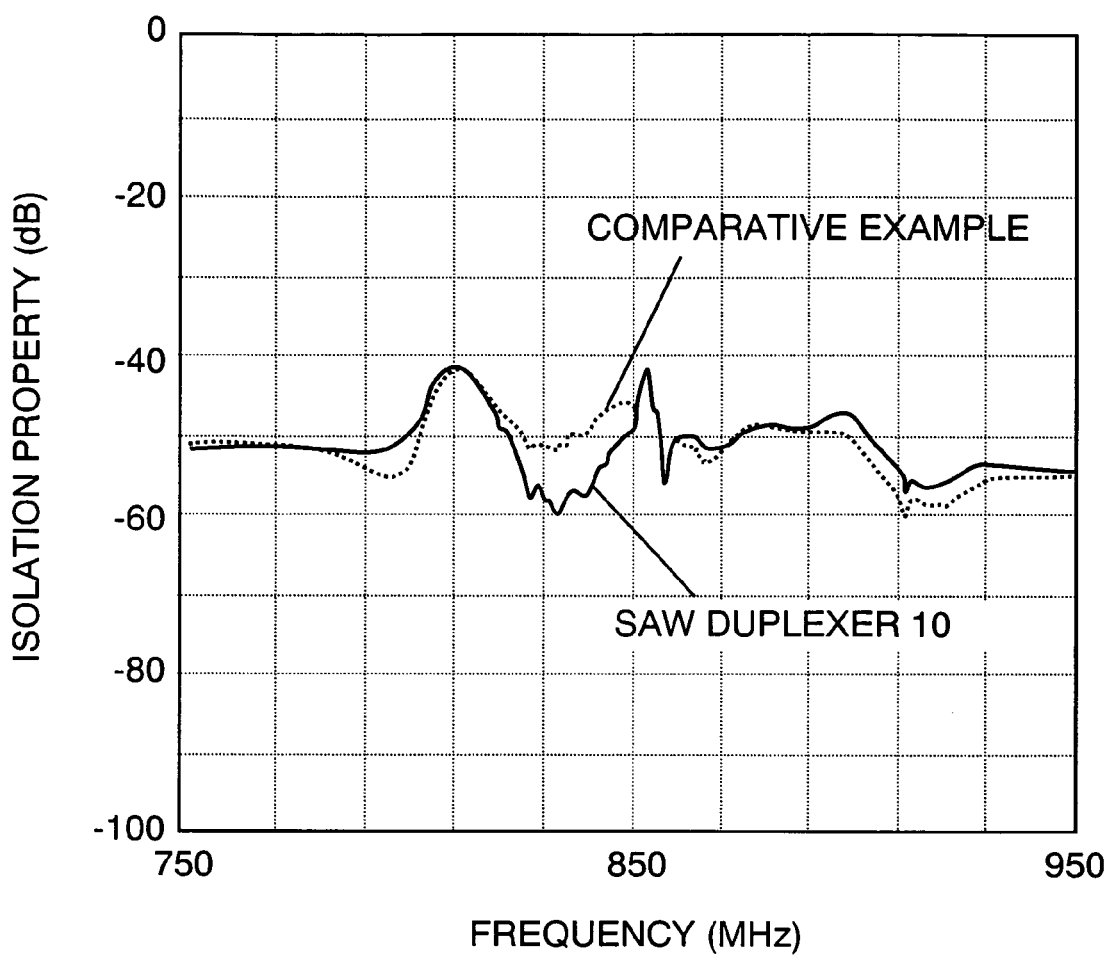
FIG. 2 is a graph showing a result of measuring the isolation property between a transmission terminal and a reception terminal with respect to frequencies of the SAW duplexer of the same embodiment.

FIG. 2 is a graph showing a result of measuring the isolation property between a transmission terminal and a reception terminal with respect to the frequency of SAW duplexer 10. The horizontal axis denotes the frequency and the vertical axis denotes the isolation property obtained from the attenuation between the transmission terminal and the reception terminal. A SAW duplexer to which shield electrode 15 is not provided is a comparative example. As can be seen from FIG. 2, it is confirmed that the isolation property in a frequency band used in the case of SAW duplexer 10 of the embodiment is better than that of SAW duplexer of the comparative example. Namely, by providing shield electrode 15, electromagnetic shield effect becomes good and the isolation property can be improved.

Figure 3:
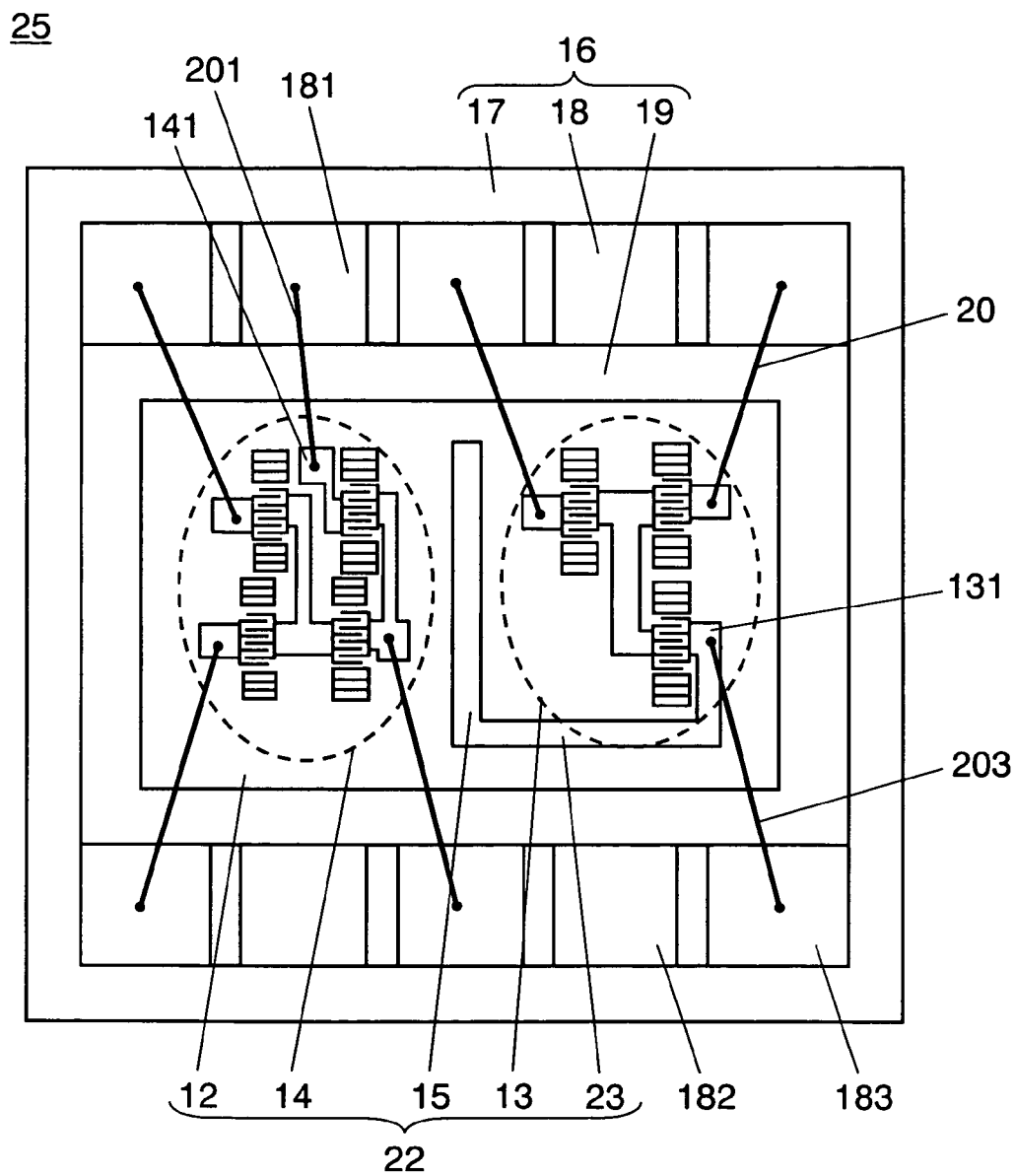
FIG. 3 is a top view showing a structure of a SAW duplexer as a modification example of the same embodiment.

FIG. 3 is a top view showing a structure of SAW duplexer 25 as a modification example of the embodiment. In SAW duplexer 25 of the modification example, transmission-side earth terminal pattern 131 of transmission filter 13 as the first surface acoustic wave filter structure is connected to shield electrode 15 by connection pattern 23. Shield electrode 15 is not connected to earth terminal 182 of package 16. These points differ from SAW duplexer 10. According to this, it is possible to reduce one wire as compared with SAW duplexer 10 shown in FIG. 1 while improving the isolation property. Therefore, man-hour and material costs for wire-bonding can be reduced.

Figure 4:
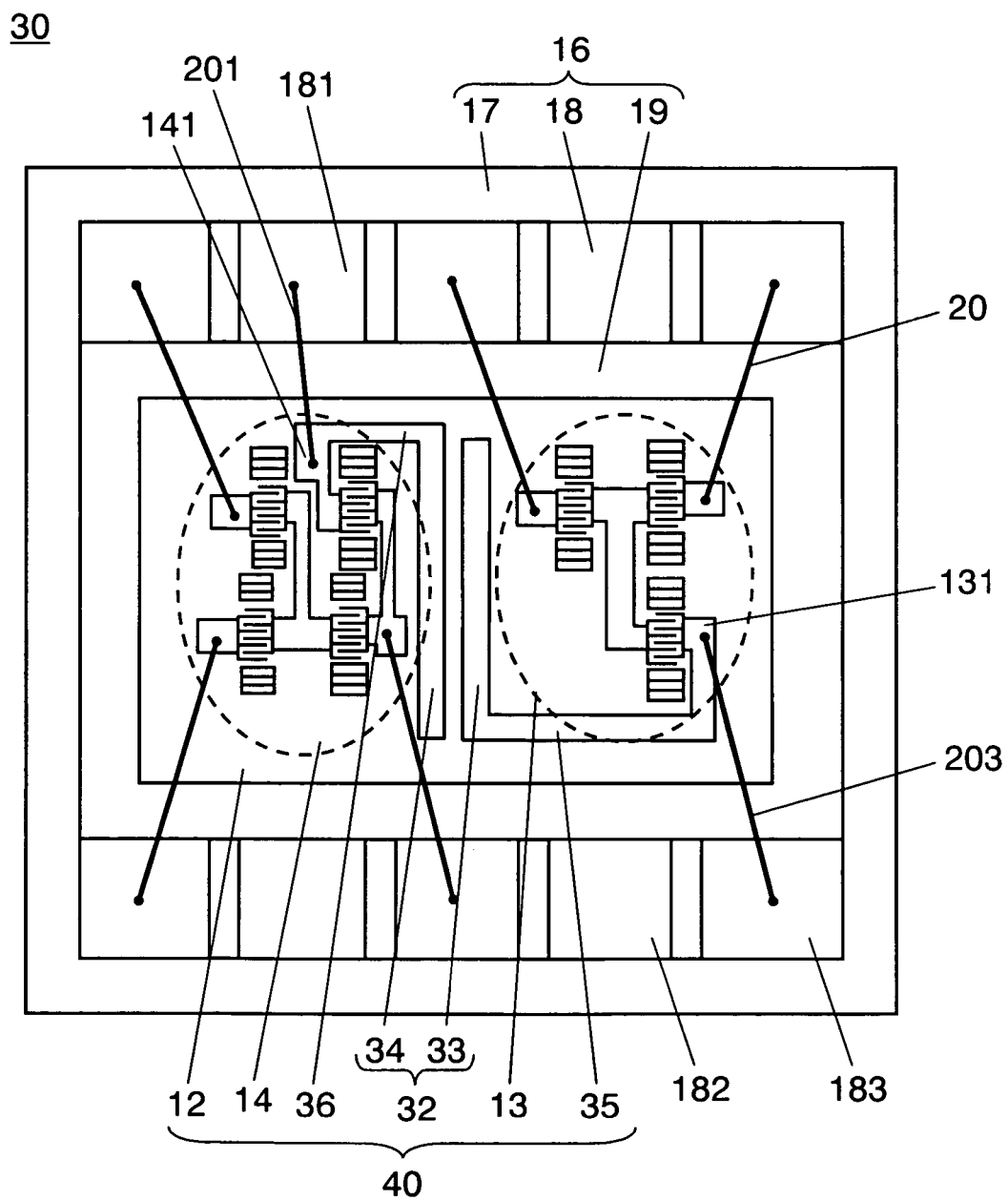
FIG. 4 is a top view showing a structure of a SAW duplexer as another modification example of the same embodiment.

FIG. 4 is a top view showing a structure of SAW duplexer 30 as another modification example of the embodiment. In SAW duplexer 30 shown in FIG. 4, shield electrode 32 includes first shield electrode 33 and second shield electrode 34, transmission-side earth terminal pattern 131 of transmission filter 13 is connected to first shield electrode 33 by first connection pattern 35, and reception-side earth terminal pattern 141 of reception filter 14 is connected to second shield electrode 34 by second connection pattern 36.

Transmission-side earth terminal pattern 131 of transmission filter 13 is connected to earth terminal 183 of package 16 by earth wire lead 203, and reception-side earth terminal pattern 141 of reception filter 14 is connected to earth terminal 181 of package 16 by earth wire lead 201. First shield electrode 33 and second shield electrode 34 are not connected to any earth terminal of terminal portions 18 of package 16.

By forming shield electrode 32, first connection pattern 35 and second connection pattern 36 as described above, connections from shield electrode 32 to earth terminals of package 16 can be performed by transmission-side earth terminal pattern 131 and reception-side earth terminal pattern 141, therefore, the number of wire lead 20 for the connection is not increased. Further, the width of shield electrode 32 is widened as a whole and formed to be long, therefore, the isolation property can be more improved. In the present modification example, first shield electrode 33 and second shield electrode 34 composing shield electrode 32 are formed separately, however, they can be connected together.

As described above, according to the embodiment, the shield electrode is formed between the transmission filter as the first surface acoustic wave filter structure and the reception filter as the second surface acoustic wave filter structure, and the shield electrode is connected to the earth terminal of the package to be grounded, thereby improving the isolation property between the transmission and reception by electromagnetic shield effect. Consequently, since a shape of the SAW element can be small, the small SAW duplexer having good isolation property can be obtained.

In the embodiment, the shield electrode, or the transmission-side earth terminal pattern or the reception-side earth terminal pattern connected to the shield electrode is connected to the earth terminal of the package by one earth wire lead, however, it can be connected by plural numbers of earth wire leads.

Second Embodiment

Figure 5:
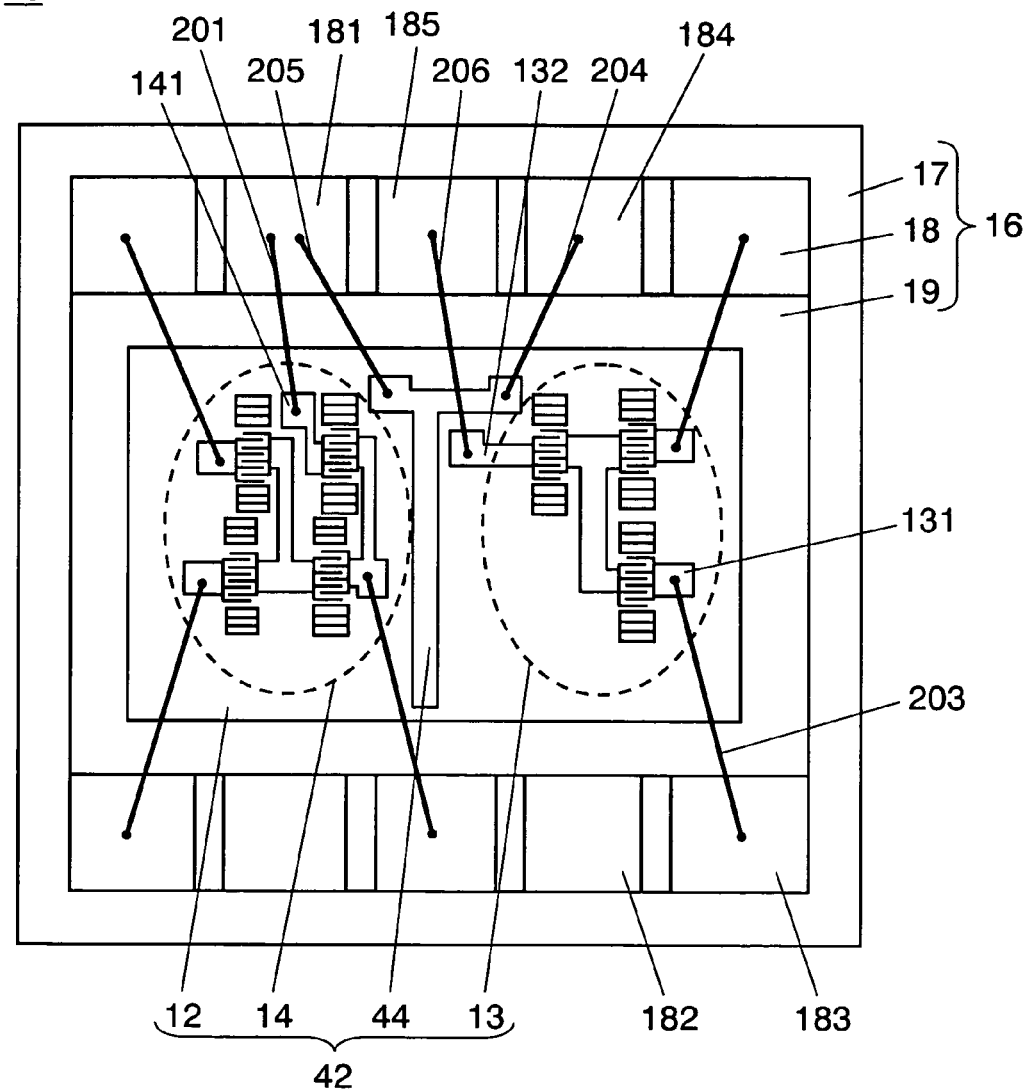
FIG. 5 is a top view showing a structure of a SAW duplexer according to a second embodiment of the invention.

FIG. 5 is a top view showing a structure of SAW duplexer 45 according to a second embodiment of the invention.

SAW duplexer 45 of the embodiment differs from SAW duplexer 10 of the first embodiment in the following structure.

First, shield electrode 44 is formed to be long so as to almost segment transmission filter 13 as a first surface acoustic wave filter structure and reception filter 14 as a second surface acoustic wave filter structure. In the embodiment, shield electrode 44 is formed to be longer than the length of transmission filter 13 and the reception filter.

Secondly, wire lead 206 for signals which connects transmission-side signal line terminal pattern 132 of transmission filter 13 to signal terminal 185 of package 16 is disposed so as to pass above shield electrode 44.

Thirdly, shield electrode 44 is connected to two points of earth terminals 181, 184 of package 16 by earth wire leads 204, 205, which are disposed so as to sandwich signal wire lead 206.

Accordingly, transmission-side signal line terminal pattern 132 is extended in the direction of shield electrode 44 as compared with SAW duplexer 10 shown in FIG. 1. In addition, shield electrode 44 is provided with a pattern in the vicinity of transmission-side signal line terminal pattern 132, in parallel with transmission-side signal line terminal pattern 132, as well as crossing signal wire lead 206. Both sides of the parallel pattern are connected to earth terminals 181, 184 by earth wire leads 204, 205 respectively. Therefore, a wire lead connecting from the center part of shield electrode 44 to the earth terminal of package 16 is not provided. As described above, SAW duplexer 45 of the embodiment is characterized in that pattern shapes of shield electrode 44 and transmission-side signal line terminal pattern 132 of transmission filter 13 are modified.

Transmission-side signal line terminal pattern 132 of the transmission filter is a common terminal pattern of transmission filter 13, namely, an antenna terminal pattern in the filter structure shown in FIG. 5.

According to such structure, electromagnetic leakage emitted from signal wire lead 206 connecting to transmission-side signal line terminal pattern 132 can be efficiently suppressed. As a result, the isolation property can be improved.

Figure 6:
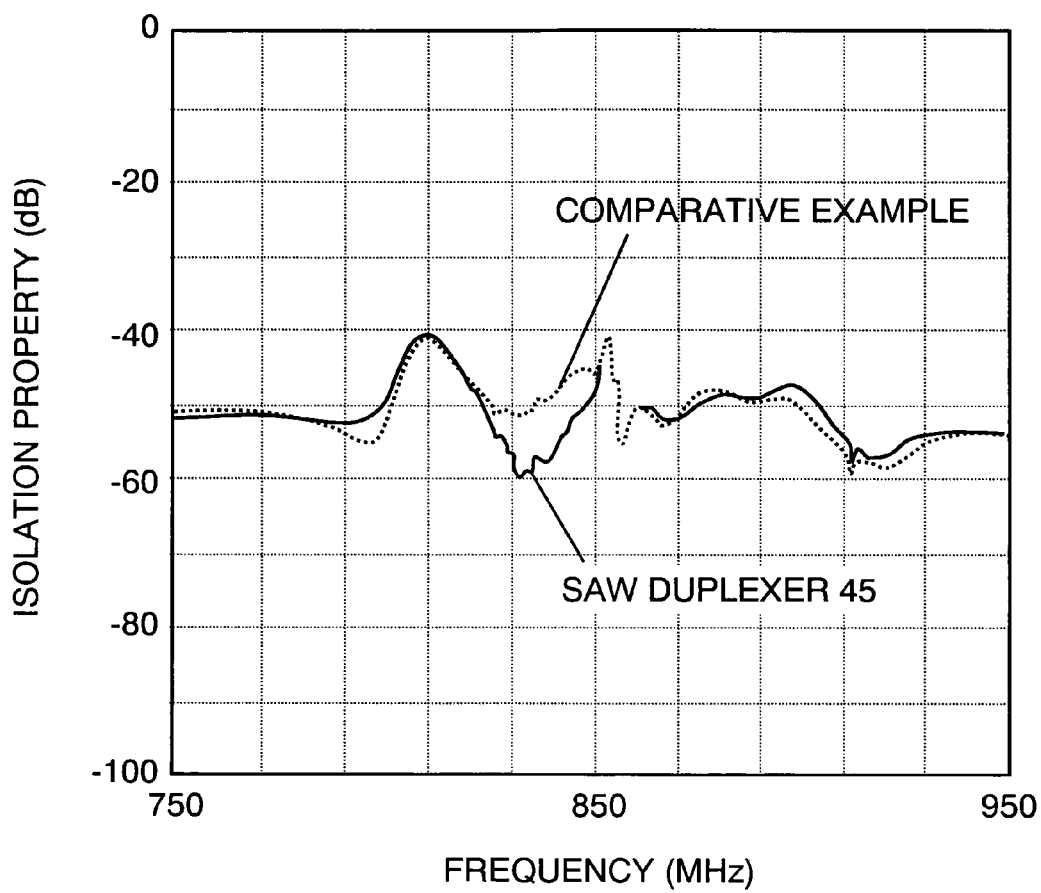
FIG. 6 is a graph showing a result of comparing the isolation property of the SAW duplexer of the same embodiment with a SAW duplexer not having a shield electrode as a comparative example in the same way as the first embodiment.

FIG. 6 is a graph showing a result of comparing the isolation property of SAW duplexer 45 with a SAW duplexer not having shield electrode 44 as a comparative example in the same way as the first embodiment. It has been found that the attenuation between the reception terminal and the transmission terminal increases and the isolation property can be improved in SAW duplexer 45 of the embodiment as compared with the comparative example.

Figure 7:
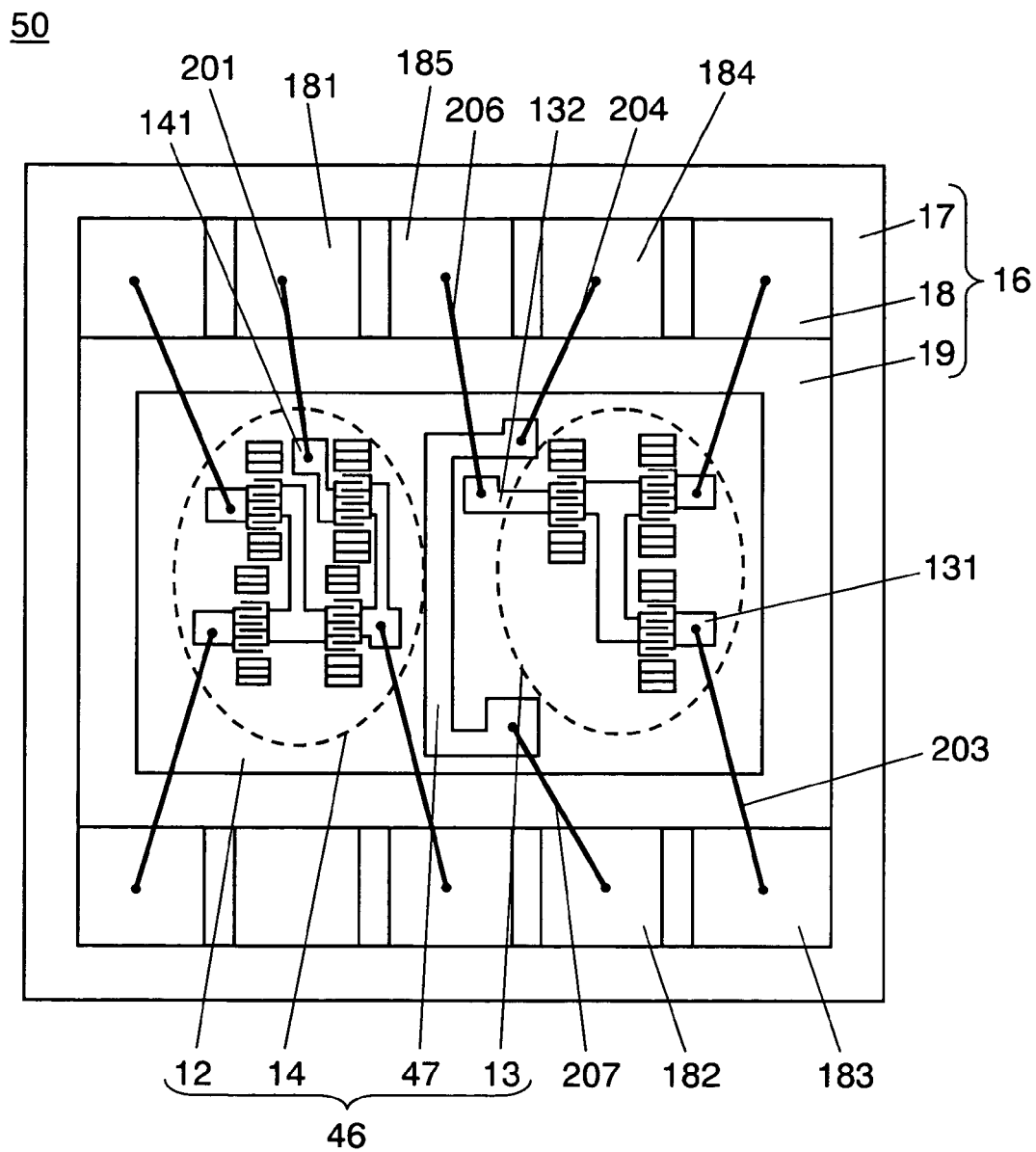
FIG. 7 is a top view showing a structure of a SAW duplexer as a modification example of the same embodiment.

In SAW duplexer 45 of the embodiment, earth wire leads 204, 205 connect shield electrode 44 and earth terminals 181, 184 of package 16, which are disposed so as to sandwich signal wire lead 206, however, the invention is not limited to this. FIG. 7 is a top view showing a structure of SAW duplexer 50 as a modification example of the embodiment. In SAW duplexer 50, a pattern shape of shield electrode 47 of SAW element 46 is modified, which is respectively connected to earth terminals 182, 184 of package 16 by earth wire leads 204, 207. Specifically, as shown in FIG. 7, shield electrode 47 is formed in a shape of "C" toward the direction of transmission-side signal line terminal pattern 132, end portions of which are connected to earth terminals 182, 184 of package 16 by earth wire leads 204, 207. In the structure, signal wire lead 206 is formed so as to pass above shield electrode 47, however, earth wire leads 204, 207 are not disposed so as to sandwich signal wire lead 206. However, in such structure, electromagnetic leakage can be suppressed, thereby improving the isolation property.

In the case of the SAW duplexer, since larger electric power is applied to transmission filter 13, it will be a serious problem that signals thereof leaks to reception filter 14. Therefore, it is preferable that shield electrodes 44, 47 are disposed under wire lead for the transmission 206 of transmission filter 13 as in SAW duplexers 45, 50 of the embodiment, since the isolation property in a transmission band can be improved.

According to the above structure, the isolation property can be further improved as compared with SAW duplexer 10 of the first embodiment, therefore, the SAW duplexer which is smaller and having better filter property can be realized.

In the embodiment, the shield electrode is connected to earth terminals of the package by two earth wire leads, however, it can be connected by three or more earth wire leads.

Third Embodiment

Figure 8:
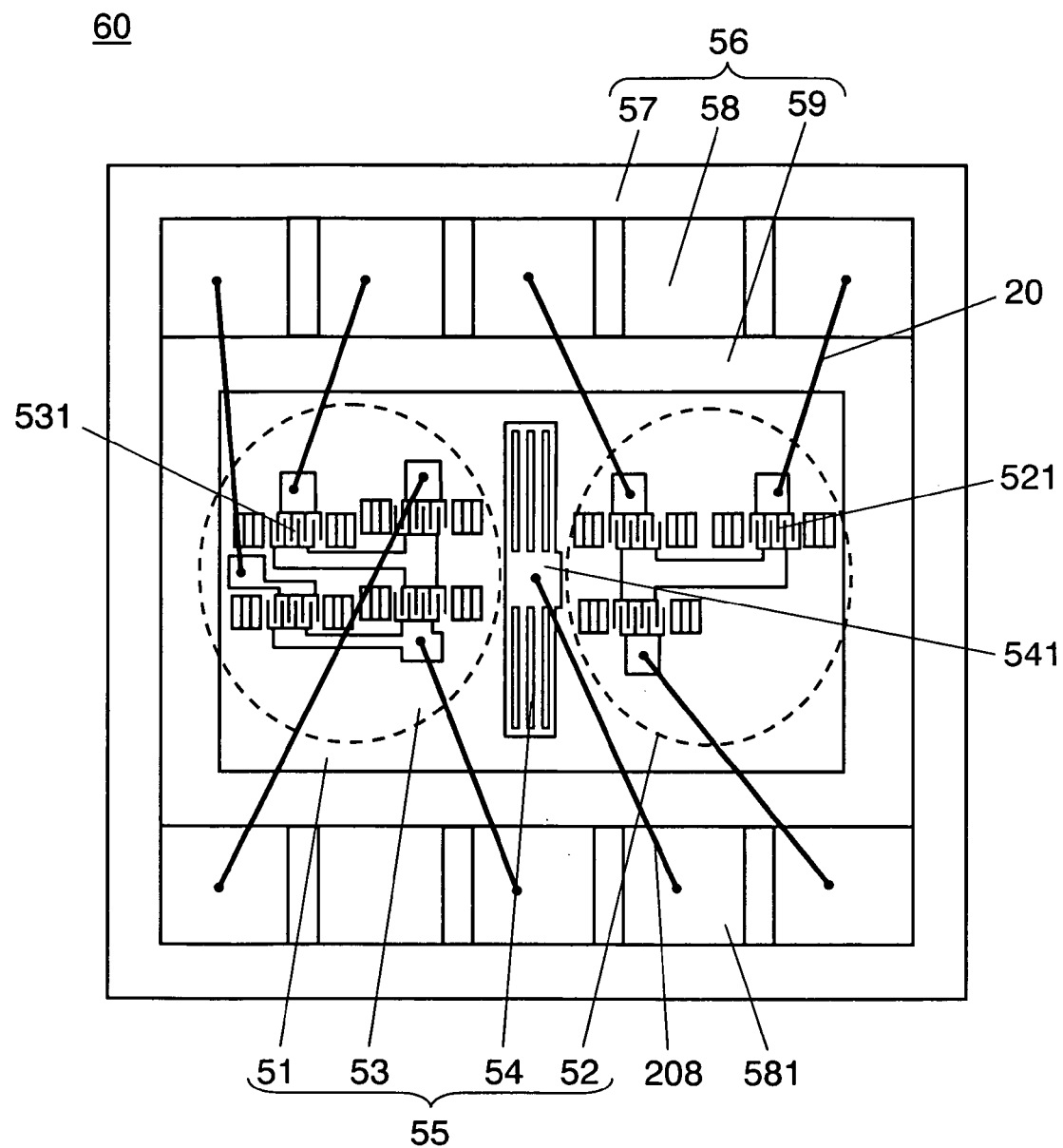
FIG. 8 is a top view showing a structure of a SAW duplexer according to a third embodiment of the invention.

FIG. 8 is a top view showing a structure of SAW duplexer 60 according to a third embodiment of the invention. SAW duplexer 60 of the embodiment includes SAW element 55, package 56 to which SAW element 55 is fixed by bonding, wire leads 20 which connect electrode patterns of SAW element 55 to terminal portions 58 of package 56 and a cover not shown.

As SAW element 55, piezoelectric substrate 51 having piezoelectricity such as a lithium tantalate (LiTaO₃) single crystal substrate, a lithium niobate (LiNbO₃) single crystal substrate, and a crystal substrate is used. An electrode thin film mainly including aluminum (Al) is formed on a surface of piezoelectric 51 and a prescribed pattern shape is formed by performing a photolithography process and an etching process. SAW element 55 includes transmission filter 52 as a first surface acoustic wave filter structure, reception filter 53 as a second surface acoustic wave filter structure and shield electrode 54 having a grating shape, which is formed between transmission filter 52 and reception filter 53.

Package 56 is made of, for example, a ceramic material, similarly to SAW duplexer 10 of the first embodiment including joining portion 57 for joining the cover, terminal portions 58 having a lower step than joining portion 57, to which wire leads 20 are bonded, bottom portion 59 having a lowest step, to which SAW element 55 is fixed by bonding. Terminal portions 58 have conductor patterns drawn from the ceramic material having a multilayer structure to a reverse portion, and soldering terminal portions (not shown) are provided at the reverse portion. The joint between joining portion 57 and the cover is performed by various kinds of methods such as a soldering, a thermal welding, an ultrasonic bonding or bonding by adhesive resin.

Wire leads 20 are connected by a wire bonding using a thermal compression bonding method or an ultrasonic method and the like.

In the embodiment of the invention, transmission filter 52 and reception filter 53 have the same ladder circuit as SAW duplexer 10 of the first embodiment. However, as shown in FIG. 8, transmission filter 52 and reception filter 53 are disposed in a parallel direction to a propagation direction of surface acoustic wave. Shield electrode 54 is arranged between transmission filter 52 and reception filter 53, which has the grating shape with plural slits in a direction parallel to comb-shaped electrodes 521, 531 as interdigital transducer electrodes included in transmission filter 52 and reception filter 53. Shield electrode 54 is disposed in a vertical direction to the propagation direction of surface acoustic wave.

Further, shield terminal pattern 541 of shield electrode 54 is connected to earth terminal 581 of terminal portions 58 of package 56 by earth wire lead 208. Connection terminal patterns of transmission filter 52 and reception filter 53 in SAW element 55 are respectively connected to predetermined terminal portions 58 of package 56 by wire leads 20. According to this, SAW duplexer 60 of the embodiment can be obtained.

According to the above structure, not only electromagnetic leakage can be suppressed, but also acoustic leakage which is propagated as surface acoustic wave can be absorbed by shield electrode 54 having the grating shape. Therefore, the isolation property can be further improved.

The pitch of grating can be selected in accordance with a frequency at which the isolation property is required to be improved. The range thereof may be set between the minimum pitch and the maximum pitch in plural resonators included in transmission filter 52 and reception filter 53 in SAW element 55.

Hereinafter, an example of a structure of SAW element 55 will be explained. A center frequency of transmission filter 52 is set to 836.5 MHz, and a center frequency of reception filter 43 is set to 881.5 MHz. For that purpose, a 36°Y-cut X propagation lithium tantalate (LiTaO₃) substrate is used as piezoelectric substrate 51. A thin film having a structure in which copper (Cu)-added aluminum (Al) alloy and titanium (Ti) are stacked on a surface of piezoelectric substrate 51 is made to be an electrode film. The film thickness thereof is approximately 400 nm.

Surface acoustic wave resonators (hereinafter referred to as resonators) in series arms and parallel arms of transmission filter 52 respectively have pitches of 2.32 μm and 2.43 μm, and these of reception filter 53 respectively have pitches of 2.20 μm and 2.31 μm. Shield electrode 54 having the grating shape of which pitch is 2.3 μm is provided between transmission filter 52 and reception filter 53. As described above, since the minimum pitch is 2.20 μm and the maximum pitch is 2.43 μm in plural resonators composing transmission filter 52 and reception filter 53 in SAW element 55, the pitch of 2.3 μm included in the range from 2.20 μm to 2.43 μm is set.

Figure 9:
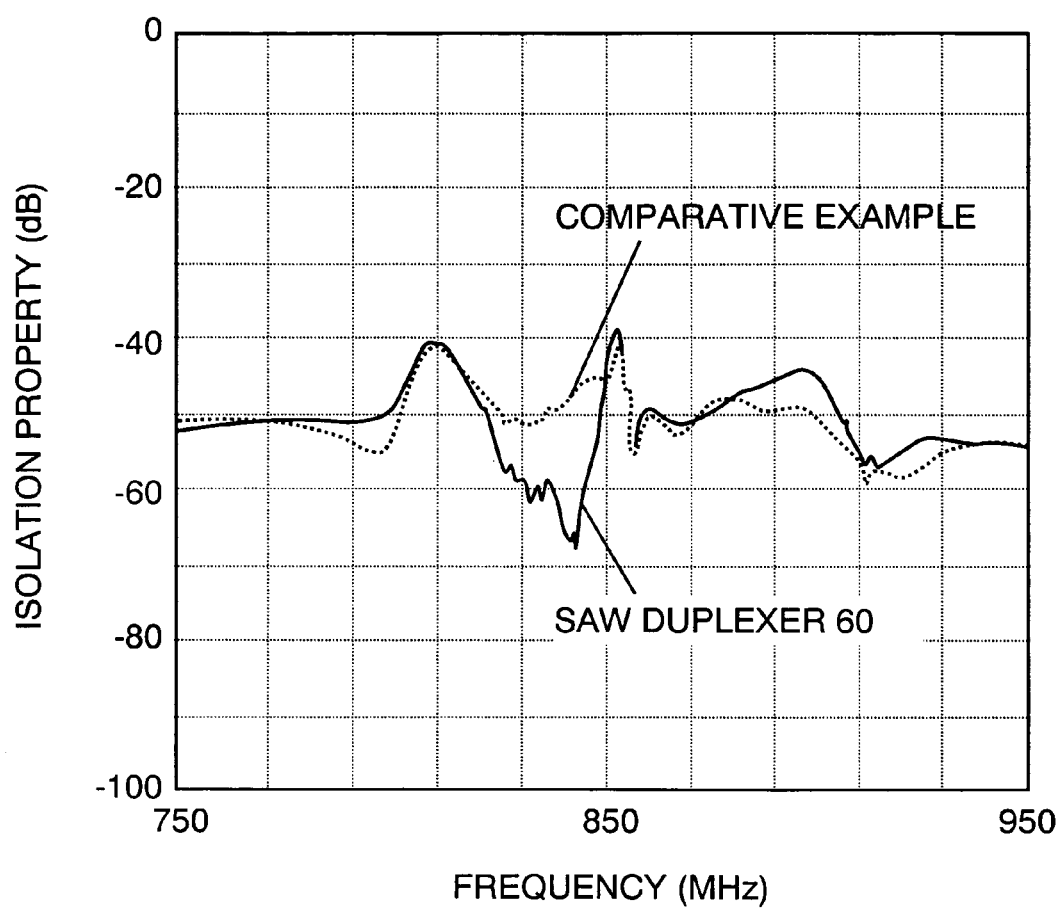
FIG. 9 is a graph showing a result of comparing the isolation property of the SAW duplexer of the same embodiment with a SAW duplexer not having a shield electrode as a comparative example in the same way as the first embodiment.

FIG. 9 is a graph showing a result of comparing the isolation property of SAW duplexer 60 with a SAW duplexer not having shield electrode 54 as a comparative example in the same way as the first embodiment. It has been found that the attenuation between the reception terminal and the transmission terminal increases and the isolation property can be improved in SAW duplexer 60 of the embodiment as compared with the comparative example.

In the SAW duplexer shown in FIG. 9, the grating pitch of shield electrode 54 having the grating shape is set to 2.3 μm, however, it is also preferable that respective grating portions have different pitches. For example, the grating pitch of one portion can be set to 2.32 μm and the grating pitch of the other portion can be set to 2.43 μm. Or, plural numbers of slit portions of which grating pitch are 2.32 μm and 2.43 μm can be provided at respective grating portions.

According to the above, acoustic signals leaked from respective resonators of the transmission filter can be efficiently absorbed, thereby further improving the isolation property. Therefore, as compared with SAW duplexer 10 of the first embodiment, not only effect by electromagnetic leakage but also effect by acoustic leakage can be reduced. AS a result, the SAW duplexer which is smaller and having good isolation property can be realized.

In the embodiment, the shield electrode is connected to the earth terminal of the package by one earth wire lead, however, it can be connected by two or more earth wire leads. For example, not only shield terminal pattern 541 at the center portion of shield electrode 54 but also shield terminal patterns are provided at both end portions, and these patterns can be connected to earth terminals of the package.

Forth Embodiment

Figure 10:
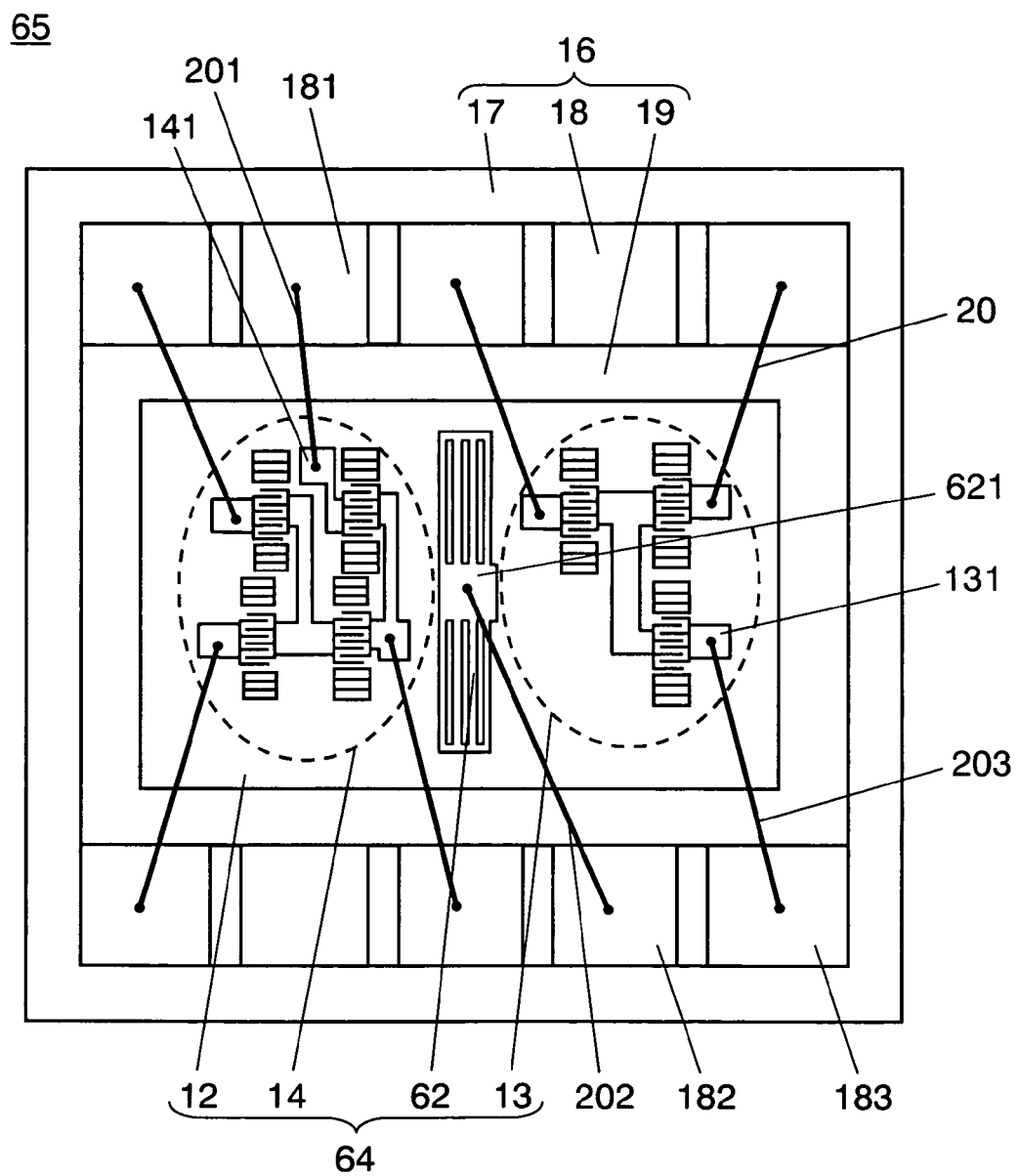
FIG. 10 is a top view showing a structure of a SAW duplexer according to a forth embodiment of the invention.

FIG. 10 is a top view showing a structure of SAW duplexer 65 according to a fourth embodiment of the invention. SAW duplexer 65 of the embodiment is a modification example of SAW duplexer 10 of the first embodiment shown in FIG. 1, which differs from SAW duplexer 10 in a shape of shield electrode 62. Specifically, in SAW duplexer 10 of the first embodiment, shield electrode 15 has a simple striped-pattern shape except the portion of shield terminal pattern 151 at the center. However, in SAW duplexer 65 of the embodiment, slits, that is, gratings are formed at the portion, similarly except shield terminal pattern 621. It has same structure as SAW duplexer 10 of the first embodiment except this point.

In FIG. 10, transmission filter 13 and reception filter 14 are disposed in a vertical direction to a propagation direction of surface acoustic wave. Shield electrode 62 is provided between them, which has the grating shape with plural slits in a vertical direction to comb-shaped electrodes composing interdigital transducer electrodes. Shield electrode 62 is also disposed in a vertical direction to the propagation direction of surface acoustic wave. SAW element 64 of the embodiment only differs from SAW element 11 of the first embodiment in the shape of shield electrode 62. It is desirable that the pitch of grating in shield electrode 62 is set to 2.3 μm when SAW duplexer 65 of the embodiment has the same transmission filter 13 and the reception filter 14 as the example of the structure in the first embodiment.

According to the above structure, not only electromagnetic signal leakage but also acoustic leakage propagated as surface acoustic wave can be absorbed by shield electrode 62 having the grating shape. As a result, the isolation property can be further improved.

The grating pitch can be selected in accordance with a frequency at which the isolation property is required to be improved, and the pitch range can be selected between the minimum pitch and the maximum pitch in resonators included in transmission filter 13 and reception filter 14.

Therefore, as compared with SAW duplexer 10 of the first embodiment, not only effect by electromagnetic leakage but also effect by acoustic leakage propagated as surface acoustic wave can be reduced, as a result, a small SAW duplexer having good isolation property can be obtained.

In the embodiment, the shield electrode is connected to the earth terminal of the package by one earth wire lead, however, it can be connected by two or more earth wire leads. For example, it is also preferable that not only shield terminal pattern 541 at the center of shield electrode 54 but also shield terminal patterns are provided at both end portions and these patterns are connected to earth terminals of the package.

Fifth Embodiment

Figure 11:
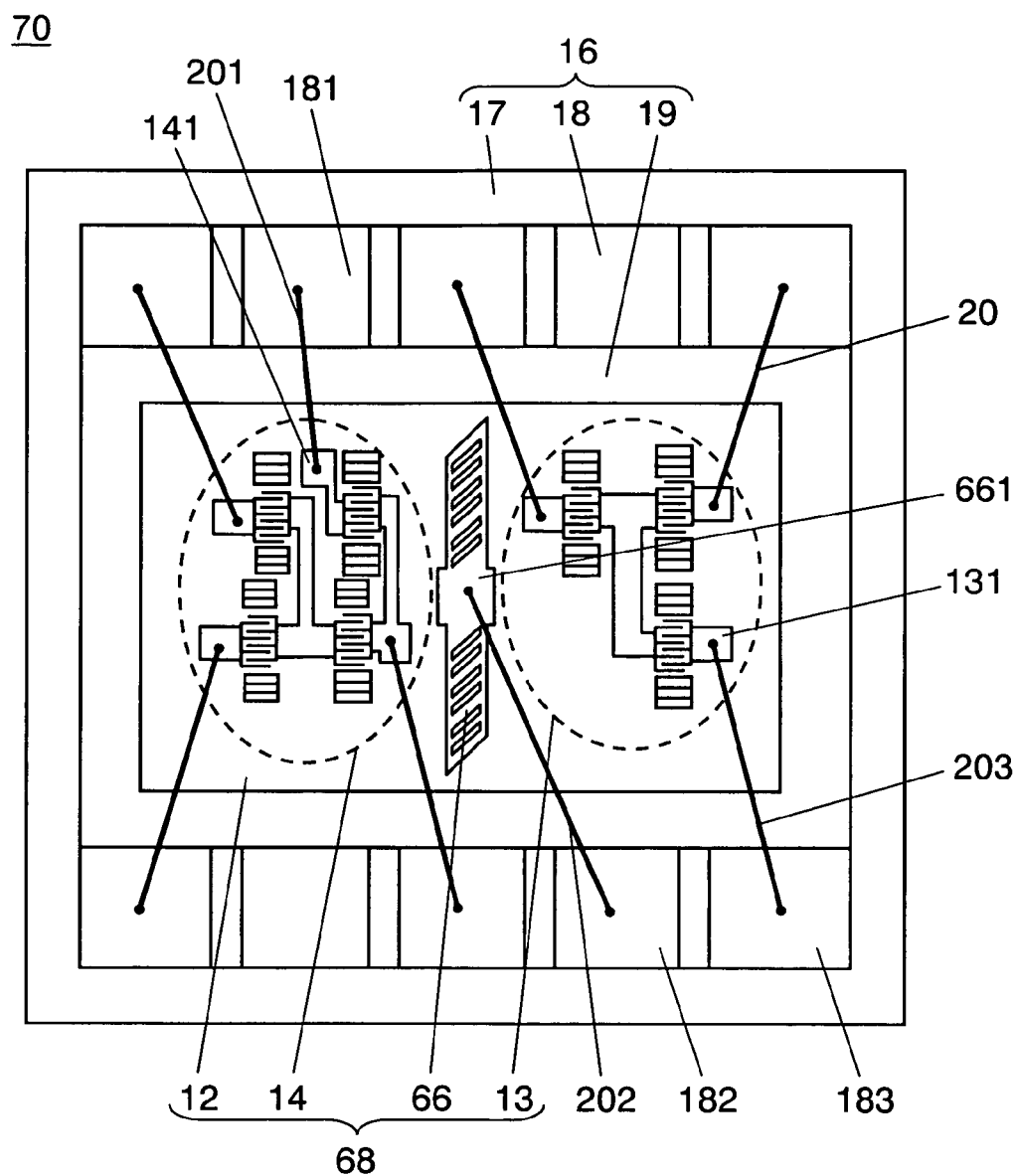
FIG. 11 is a top view showing a structure of a SAW duplexer according to a fifth embodiment of the invention.

FIG. 11 is a top view showing a structure of SAW duplexer 70 according to a fifth embodiment of the invention. The difference between SAW duplexer 70 of the embodiment and SAW duplexer 10 of the first embodiment is that a shape of the shield electrode is modified. SAW duplexer 70 of the embodiment is a modification example of SAW duplexer 10 of the first embodiment shown in FIG. 1, which differs from SAW duplexer 10 in the shape of the shield electrode. Specifically, in SAW duplexer 10 of the first embodiment, shield electrode 15 has a simple striped-pattern shape except the portion of shield terminal pattern 151 at the center. However, in SAW duplexer 70 of the embodiment, gratings are formed, similarly except the portion of shield terminal pattern 661. The present embodiment has a structure in which gratings are provided in an oblique direction to the propagation direction of surface acoustic wave except shield terminal pattern 661 in shield electrode 66. Other structures are made to be the same as the first embodiment to form a surface acoustic wave duplexer.

In FIG. 11, shield electrode 66 having gratings, for example, of which pitch is 2.3 μm in an oblique direction to the comb-shaped electrodes is provided between transmission filter 13 and reception filter 14.

According to the above structure, not only electromagnetic signal leakage but also acoustic leakage can be absorbed by the shield electrode having the grating shape, therefore, the isolation property can be further improved.

Consequently, as compared with the first embodiment, not only electromagnetic leakage but also acoustic leakage propagated by surface acoustic wave can be reduced, as a result, a small surface acoustic wave duplexer having good isolation property an be obtained.

In the embodiment, the shield electrode is connected to the earth terminal of the package by one earth wire lead, however, it can be connected by two or more earth wire leads. For example, it is preferable that not only shield terminal pattern 661 at the center of shield electrode 66, but also shield terminal patterns are provided at both end portions, these patterns can be connected to earth terminals of the package.

Sixth Embodiment

Figure 12:
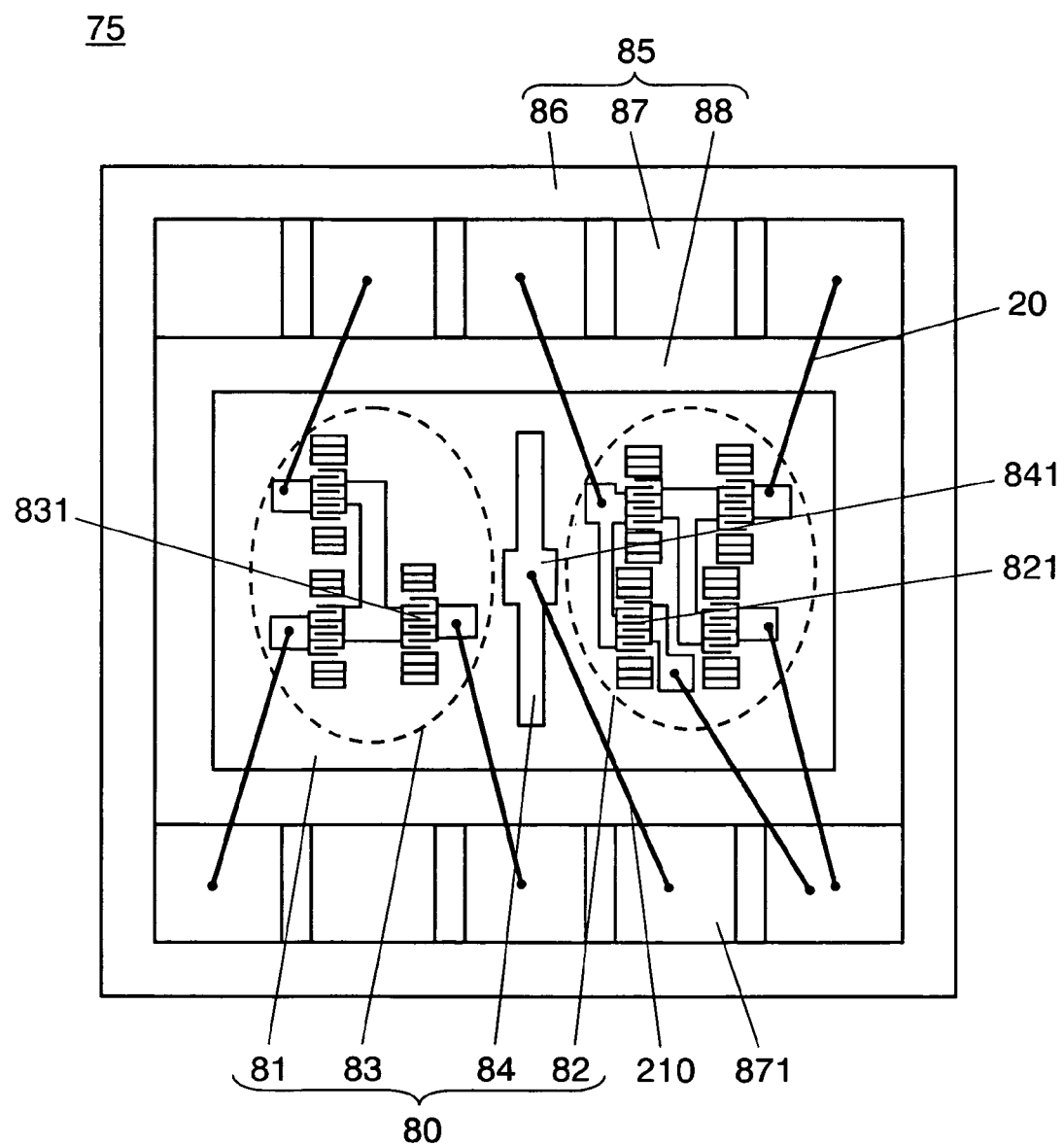
FIG. 12 is a top view showing a structure of a SAW duplexer according to a sixth embodiment of the invention.

FIG. 12 is a top view showing a structure of SAW duplexer 75 according to a sixth embodiment of the invention. SAW duplexer 75 of the invention differs from SAW duplexer 10 of the first embodiment in the following point. In the structure of SAW duplexer 10 of the first embodiment, a resonator which is nearest to reception filter 14 in transmission filter 13 having the lower frequency is a series arm resonator, and a resonator which is nearest to transmission filter 13 in reception filter 14 is a parallel arm resonator. However, in the structure of SAW duplexer 75 of the embodiment, a resonator which is nearest to reception filter 83 in transmission filter 82 having the lower frequency is a parallel arm resonator, and a resonator which is nearest to transmission filter 82 in reception filter 83 is a series arm resonator.

Specifically, transmission filter 82 and reception filter 83 formed by ladder circuits respectively are disposed in a vertical direction to a propagation direction of surface acoustic wave, and shield electrode 84 is provided therebetween. Resonator 821 which is nearest to reception filter 83 in resonators included in transmission filter 82 is made to be a parallel resonator. Further, resonator 831 which is nearest to transmission filter 82 in resonators included in reception filter 83 is made to be a series arm resonator. In the case using the ladder circuit, a resonant frequency of a series arm resonator is higher than a resonant frequency of a parallel arm resonator. According to the above structure, the difference between resonant frequencies of resonators which are arranged nearest to each other in the first filter structure and the second filter structure can be largest. As a result, the isolation property can be further improved, and a small SAW duplexer having good isolation property can be obtained.

Hereinafter, one example of a structure of SAW element 80 will be explained. A center frequency of transmission filter 82 is set to 836.5 MHz, a center frequency of reception filter 83 is set to 881.5 MHz. For that purpose, a 36°Y-cut X propagation lithium tantalate ($LiTaO_3$) single crystal substrate is used as piezoelectric substrate 81. A thin film having a structure in which copper (Cu)-added aluminum (Al) alloy and titanium (Ti) are stacked on a surface of piezoelectric substrate 81 is made to be an electrode film. The film thickness thereof is approximately 400 nm.

The resonators in series arms and parallel arms of transmission filter 82 respectively have pitches of 2.32 μm and 2.43 μm, and these of reception filter 83 respectively have pitches of 2.20 μm and 2.31 μm. The width of shield electrode 84 formed between transmission filter 82 and reception filter 83 is approximately 100 μm.

SAW element 80 fabricated as described above is fixed by bonding to package 85, and respective connection terminal patterns of SAW element 80 are connected to terminal portions 87 of package 85 by wire leads 20, finally, sealed with a cover to fabricate SAW duplexer 75. Shield terminal pattern 841 of shield electrode 84 is connected to earth terminal 871 of package 85 by earth wire lead 210. Similarly to SAW duplexer 10 of the first embodiment, package 85 is made of, for example, a ceramic material, including joining portion 86 for joining the cover, terminal portions 87 having a lower step than joining portion 86, to which wire leads 20 are bonded, bottom portion 88 having a lowest step, to which SAW element 80 is fixed by bonding.

Figure 13:
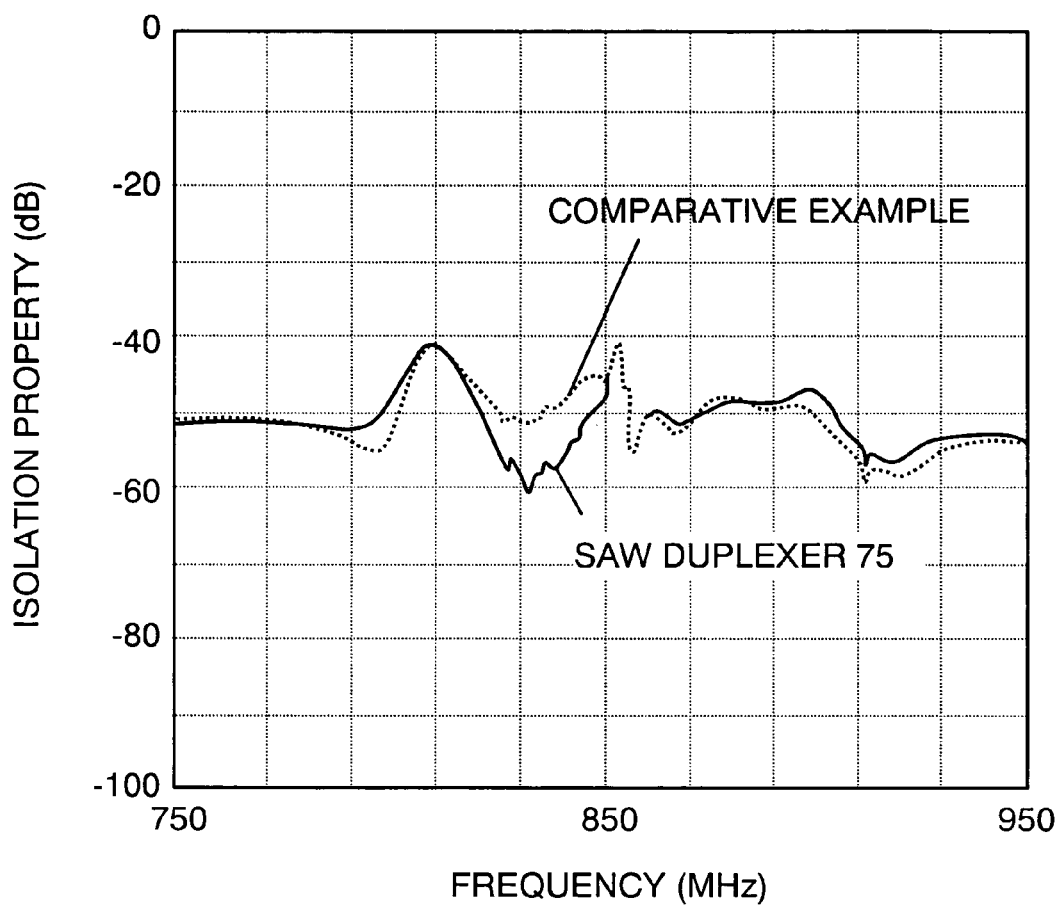
FIG. 13 is a graph showing a result of comparing the isolation property of the SAW duplexer of the same embodiment with a SAW duplexer not having a shield electrode as a comparative example in the same way as the first embodiment.
Figure 14:
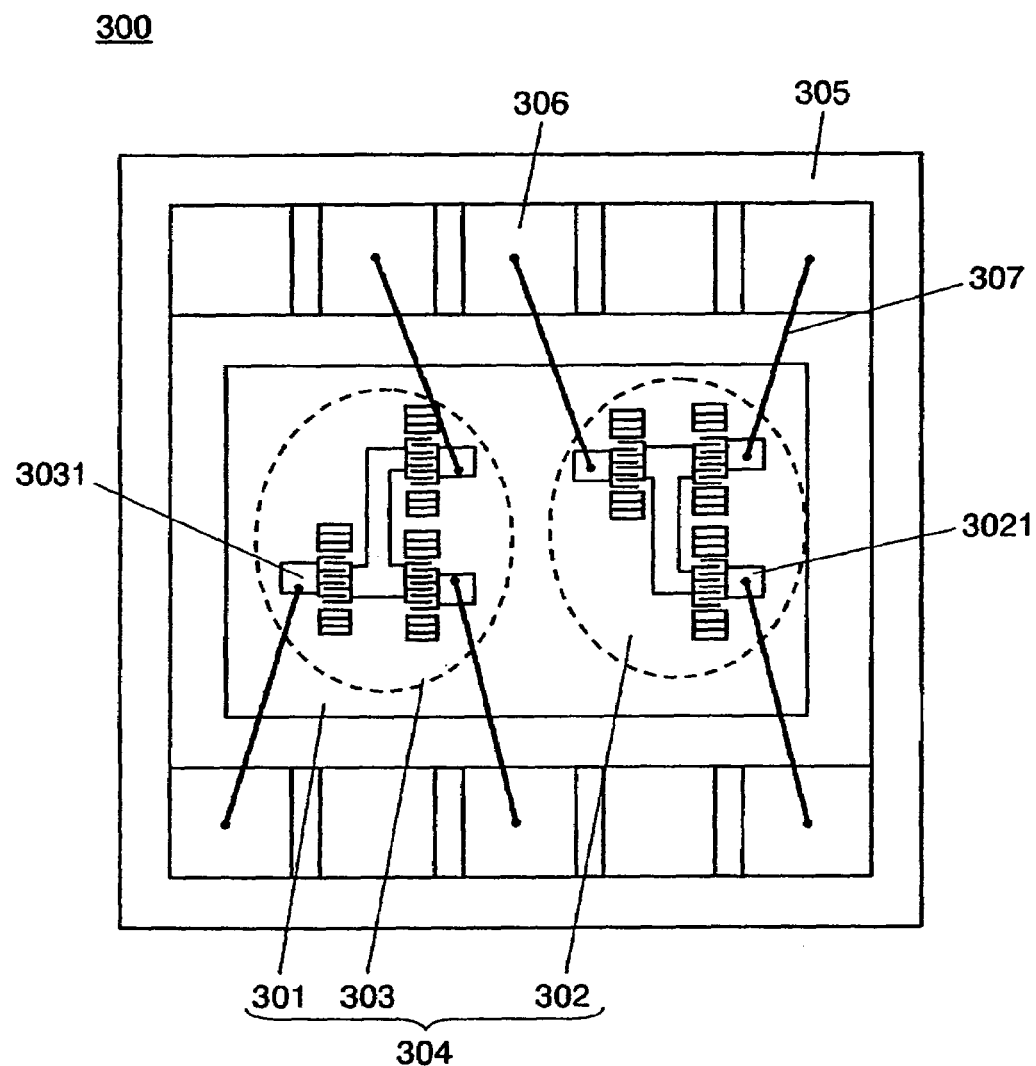
FIG. 14 is a top view showing the inside of a package of a conventional SAW duplexer.

FIG. 13 is a graph showing a result of comparing the isolation property of SAW duplexer 75 with a SAW duplexer not having shield electrode 84 as a comparative example in the same way as the first embodiment. It has been found that the attenuation between the reception terminal and the transmission terminal increases as compared with the comparative example and the isolation property can be improved in SAW duplexer 75 of the embodiment.

In the embodiment, the shield electrode is connected to the earth terminal of the package by one earth wire lead, however, it can be connected by plural earth wire leads.

In the first embodiment to the sixth embodiment, the invention is explained taking a SAW duplexer as an example, however, the invention is not limited to this. The same effect can be obtained by a surface acoustic wave filter in which two kinds of filters having different frequencies formed on one piezoelectric substrate.

INDUSTRIAL APPLICABILITY

A surface acoustic wave device of the invention is useful for applying to a mobile phone and the like owing to miniaturization thereof because electromagnetic interference between filters can be prevented and the isolation property can be improved in the case that filters having different center frequencies on a piezoelectric substrate.

The invention claimed is:

1. A surface acoustic wave device including a structure in which a surface acoustic wave element provided with two kinds of surface acoustic wave filter structures having different center frequencies on a same piezoelectric substrate is disposed on a package, said surface acoustic wave element comprising:
   a first filter structure having a first center frequency;
   a second filter structure having a second center frequency;
   a shield electrode positioned between said first filter structure and the second filter structure, said shield electrode being connected to an earth terminal of the package to be grounded and comprising a first shield electrode and a second shield electrode;
   a first connection pattern configured to connect an earth terminal pattern of said first filter structure to said first shield electrode; and
   a second connection pattern configured to connect an earth terminal pattern of said second filter structure to said second shield electrode.

2. The surface acoustic wave device of claim 1, wherein said surface acoustic wave element further comprises a connection pattern configured to connect an earth terminal pattern of either said first filter structure or said second filter structure to said shield electrode.

3. The surface acoustic wave device of claim 1,
   wherein said shield electrode is formed to be longer than said first filter structure and said second filter structure to segment said first filter structure and said second filter structure.

4. The surface acoustic wave device of claim 1, wherein said first filter structure and said second filter structure are, respectively, a transmission filter and a reception filter, and the transmission filter and the reception filter form a surface acoustic wave duplexer.

5. The surface acoustic wave device of claim 4, wherein a signal line terminal pattern is an input/output terminal pattern of either the transmission filter or the reception filter.

6. A surface acoustic wave device including a structure in which a surface acoustic wave element provided with two kinds of surface acoustic wave filter structures having different center frequencies on a same piezoelectric substrate is disposed on a package, said surface acoustic wave element comprising:
   a first filter structure having a first center frequency;
   a second filter structure have a second center frequency;

a shield electrode positioned between said first filter structure and said second filter structure, said shield electrode being connected to an earth terminal of the package to be grounded; and a pattern in which said shield electrode is configured to cross a signal wire lead connecting at least one signal line terminal pattern in said first filter structure and said second filter structure to a signal terminal of the package, wherein said shield electrode is connected to an earth terminal of the package by at least two earth wire leads that are arranged at both sides of the signal wire lead connecting the signal line terminal pattern to the signal terminal of the package.

7. The surface acoustic wave device of claim 6, wherein said shield electrode is formed to be longer than said filter structure and said second filter structure to segment said first filter structure and said second filter structure.

8. The surface acoustic wave device of claim 6, wherein said first filter structure and said second filter structure are, respectively, a transmission filter and a reception filter, and the transmission filter and the reception filter form a surface acoustic wave duplexer.

9. The surface acoustic wave device of claim 8, wherein a signal line terminal pattern is an input/output terminal pattern of either the transmission filter or the reception filter.

10. A surface acoustic wave device including a structure in which a surface acoustic wave element provided with two kinds of surface acoustic wave filter structures having different center frequencies on a same piezoelectric substrate is disposed on a package, said surface acoustic wave element comprising:

a first filter structure having a first center frequency;

a second filter structure have a second center frequency; and a shield electrode positioned between said first filter structure and said second filter structure, said shield electrode being connected to an earth terminal of the package to be grounded;

wherein said filter structure, said second filter structure and said shield electrode are disposed in a vertical direction to a propagation direction of surface acoustic waves of said first filter structure and said second filter structure, and wherein said shield electrode has a grating shape including plural slits in a vertical direction relative to comb-shaped electrodes in said filter structure and said second filter structure.

11. The surface acoustic wave device of claim 10, wherein said first filter structure and said second filter structure are ladder circuits configured to connect one-terminal surface acoustic wave resonators in series arms and in parallel arms, and a surface acoustic wave resonator which is nearest to said second filter structure in said first filter structure having a low center frequency is a parallel arm, and a surface acoustic wave resonator which is nearest to said first filter structure in said second filter structure is a series arm.

12. The surface acoustic wave device of claim 10, wherein said shield electrode has a grating shape including plural slits in an oblique direction to a propagation direction of surface acoustic waves in said first filter structure and said second filter structure.

13. The surface acoustic wave device of claim 10, wherein the slits of said shield electrode are formed by pitches between a minimum pitch and a maximum pitch of comb-shaped electrodes included in said first filter structure and said second filter structure.

14. The surface acoustic wave device of claim 10, wherein the slits of said shield electrode are formed by different pitches depending on positions.

15. The surface acoustic wave device of claim 10, wherein said shield electrode is formed to be longer than said first filter structure and said second filter structure to segment said first filter structure and said second filter structure.

16. The surface acoustic wave device of claim 10, wherein said first filter structure and said second filter structure are, respectively, a transmission filter and a reception filter, and the transmission filter and the reception filter form a surface acoustic wave duplexer.

17. The surface acoustic wave device of claim 16, wherein a signal line terminal pattern is an input/output terminal pattern of either the transmission filter or the reception filter.

18. A surface acoustic wave device including a structure in which a surface acoustic wave element provided with two kinds of surface acoustic wave filter structures having different center frequencies on a same piezoelectric substrate is disposed on a package, said surface acoustic wave element comprising:

a first filter structure having a first center frequency;

a second filter structure have a second center frequency; and a shield electrode positioned between said first filter structure and said second filter structure, said shield electrode being connected to an earth terminal of the package to be grounded;

wherein said first filter structure and said second filter structure are disposed in parallel to a propagation direction of surface acoustic waves of said first filter structure and said second filter structure, and said shield electrode is disposed in a vertical direction to the propagation direction of surface acoustic waves, and wherein said shield electrode has a grating shape including plural slits in a parallel direction relative to comb-shaped electrodes in said filter structure and said second filter structure.

19. The surface acoustic wave device of claim 18, wherein said shield electrode is formed to be longer than said first filter structure and said second filter structure to segment said first filter structure and said second filter structure.

20. The surface acoustic wave device of claim 18, wherein said first filter structure and said second filter structure are, respectively, a transmission filter and a reception filter, and the transmission filter and the reception filter form a surface acoustic wave duplexer.

21. The surface acoustic wave device of claim 20, wherein a signal line terminal pattern is an input/output terminal pattern of either the transmission filter or the reception filter.

* * * * *